(12) United States Patent
Reyes

(10) Patent No.: US 6,639,223 B2
(45) Date of Patent: Oct. 28, 2003

(54) GASEOUS ION SOURCE FEED FOR OXYGEN ION IMPLANTATION

(75) Inventor: Jaime M. Reyes, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 10/139,411

(22) Filed: May 6, 2002

(65) Prior Publication Data

US 2002/0166975 A1 Nov. 14, 2002

Related U.S. Application Data

(60) Provisional application No. 60/290,244, filed on May 11, 2001.

(51) Int. Cl.[7] ................................................. H01J 37/08
(52) U.S. Cl. ................... 250/425; 250/423 R; 250/424; 250/426; 250/492.21; 315/111.81
(58) Field of Search ................................. 250/425, 424, 250/426, 423 R, 492.1, 492.21; 315/111.81, 111.91

(56) References Cited

U.S. PATENT DOCUMENTS

| 5,808,416 | A | * | 9/1998 | Armini | 315/111.81 |
| 5,892,232 | A | * | 4/1999 | Tsai et al. | 250/426 |
| 6,355,933 | B1 | * | 3/2002 | Tripsas et al. | 250/427 |

* cited by examiner

Primary Examiner—John R. Lee
Assistant Examiner—James P. Hughes

(57) ABSTRACT

Methods and apparatus are provided for generating oxygen ions in an ion source having an arc chamber containing at least one oxidizable metal. The method includes the steps of feeding gaseous $H_2O$ into the arc chamber and operating the arc chamber in a temperature range where the free energy of formation of gaseous $H_2O$ is less than the free energy of formation of oxides of the oxidizable metal.

21 Claims, 6 Drawing Sheets

GASEOUS ION SOURCE FEED FOR OXYGEN ION IMPLANTATION

CROSS-REFERENCE TO RELATED APPLICATION

This application claims the benefit of provisional application Ser. No. 60/290,244, filed May 11, 2001, which is hereby incorporated by reference in its entirety.

FIELD OF THE INVENTION

This invention relates to ion sources that are suitable for use in ion implanters and, more particularly, to ion sources for generating oxygen ions.

BACKGROUND OF THE INVENTION

An ion source is a critical component of an ion implanter. The ion source generates an ion beam which passes through the beamline of the ion implanter and is delivered to a semiconductor wafer. The ion source is required to generate a stable, well-defined beam for a variety of different ion species and extraction voltages. In a semiconductor production facility, including the ion implanter, including the ion source, is required to operate for extended periods without the need for maintenance or repair. In addition, the ion source is required to generate a relatively high current ion beam so that implant times to achieve a given dose are kept as short as possible.

In applications which require implantation of oxygen ions, oxygen must be ionized in the ion source. Ordinary oxygen-bearing gases create an oxidizing environment for the refractory materials that are used in the ion source arc chamber. Consequently, these refractory materials, typically tungsten and molybdenum, are oxidized during operation of the ion source for oxygen implantation. The hot tungsten filament or cathode is consumed at an accelerated rate due to oxidation, resulting in extremely short source life. Tungsten and molybdenum oxides, which are gaseous and which are more stable at high temperatures, vaporize and deposit metallic tungsten or molybdenum on arc chamber components that operate at lower temperatures. These deposits accumulate and may create electrical shorts across normally insulating components. Such electrical shorts further reduce the service life of the ion source.

Prior art ion sources have used $CO_2$, CO, $N_2O$, NO and $NO_2$ gases, instead of $O_2$, to lower the oxidizing potential. Carbonaceous gases, such as $CO_2$ and CO, result in the deposition of carbon or graphite on the components of the arc chamber, thereby creating electrical shorts that reduce the service life of the ion source.

All of the known prior art oxygen ion sources have had one or more disadvantages, including short operating life and deposition of conductive materials on components of the arc chamber. Accordingly, there is a need for improved methods and apparatus for generating oxygen ions.

SUMMARY OF THE INVENTION

In accordance with an aspect of the invention, water vapor (gaseous $H_2O$) is used as a source feed material for the implantation of oxygen. In order to prevent the rapid oxidation of components inside the arc chamber in the presence of an oxygen-bearing gas, the free energy of formation of the gas must be lower than the free energy of formation of the oxides of the tungsten filament and of any other refractory metals in the arc chamber, typically tungsten or molybdenum, for most of the temperature range of operation of the source. The minimum free energy state of the system is that which keeps the oxygen-bearing gas concentration maximum, thereby preventing or slowing the oxidation of the refractory metals. Problems of short source life and electrically shorting deposits, normally caused by the presence of an oxygen-bearing gas, are avoided or minimized.

According to another aspect of the invention, a method is provided for generating oxygen ions in an ion source including an arc chamber containing at least one oxidizable metal. The method comprises the steps of feeding gaseous $H_2O$ into the arc chamber and operating the arc chamber in a temperature range where the free energy of formation of gaseous $H_2O$ is less than the free energy of formation of oxides of the oxidizable metal.

In one embodiment, the metal comprises tungsten and the arc chamber is operated in a temperature range of about 960° C. to about 3300° C. In another embodiment, the metal comprises molybdenum and the arc chamber is operated in a temperature range of about 1050° C. to about 2800° C. In a further embodiment, the metal comprises rhenium, and temperature control is not required to limit oxidation.

The temperature of the arc chamber may be controlled within the specified temperature range. In one embodiment, the temperature is controlled by thermally shielding the arc chamber.

According to a further aspect of the invention, an oxygen ion source is provided. The oxygen ion source comprises an arc chamber containing a cathode, a source of gaseous $H_2O$ coupled to the arc chamber for introducing gaseous $H_2O$ into the arc chamber, and an energy source for producing a plasma in the arc chamber.

The ion source may further comprise a temperature control device for operating the arc chamber in a temperature range where the free energy of formation of gaseous $H_2O$ is less than the free energy of formation of oxides of oxidizable metals located in the arc chamber.

The arc chamber may be fabricated of tungsten, molybdenum, rhenium or alloys containing these metals, and the cathode may be fabricated of tungsten, molybdenum, rhenium or alloys containing these metals.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
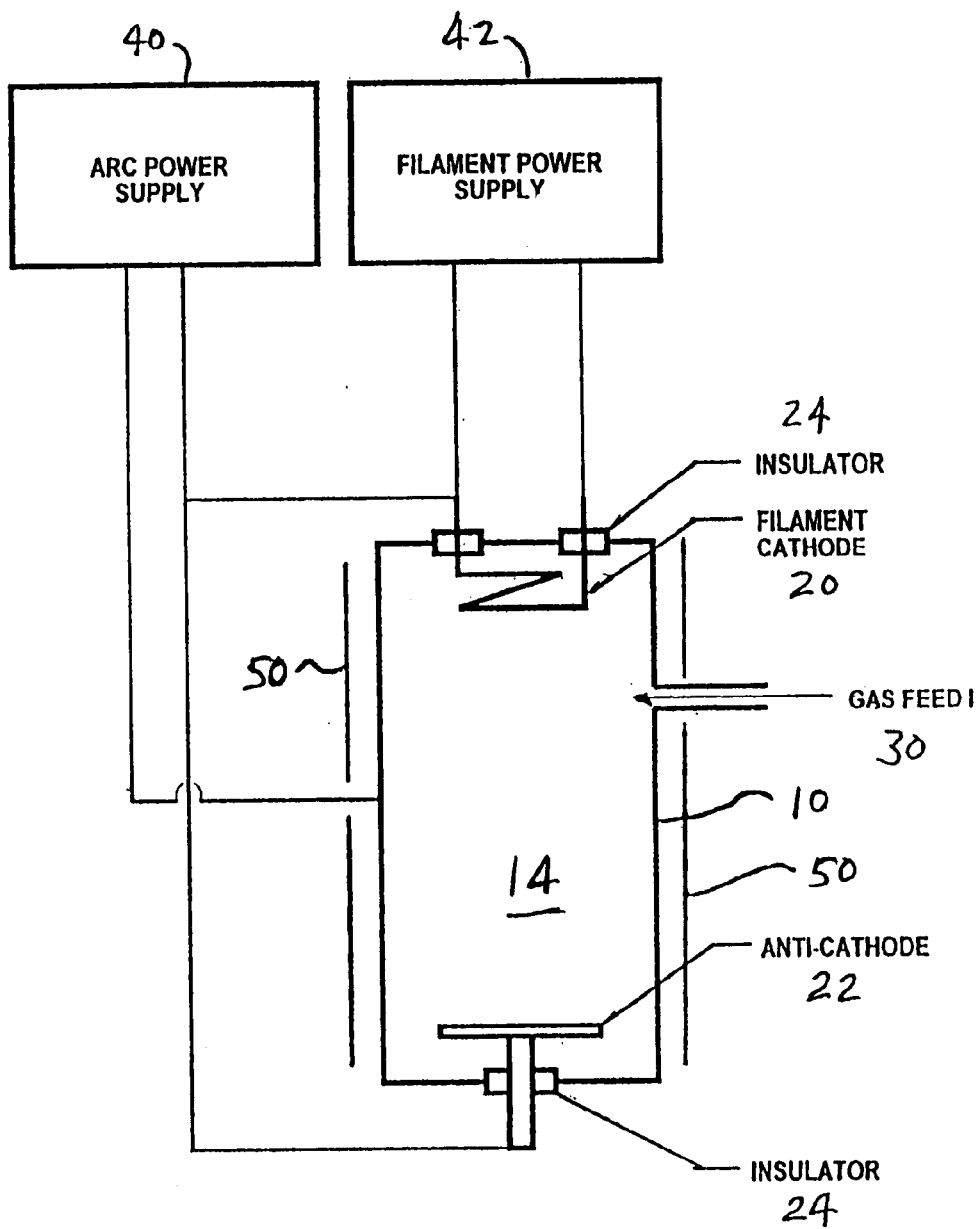
FIG. 1 is a schematic diagram of an ion source suitable for incorporation of the invention.

An ion source suitable for incorporation of the present invention is shown in FIG. 1. An arc chamber housing 10 defines an arc chamber 14. A filament cathode 20 and a repeller electrode, or anti-cathode, 22 are positioned within arc chamber 14. Filament cathode 20 and repeller electrode 22 are electrically isolated from arc chamber housing 10 by insulators 24. A gas to be ionized is provided to arc chamber 14 through a gas feed 30. Arc chamber housing 10 is provided with an extraction aperture (not shown) for extraction of an ion beam. The arc chamber housing 10 may be fabricated of tungsten, molybdenum, rhenium or alloys containing these metals, and the filament cathode 20 may be fabricated of tungsten, molybdenum, rhenium or alloys containing these metals.

An arc power supply 40 has a positive terminal connected to arc chamber housing 10 and a negative terminal connected to filament cathode 20 and to repeller electrode 22. The arc power supply 40 accelerates electrons emitted by filament cathode 20 into a plasma in arc chamber 14. A filament power supply 42 has output terminals connected to filament cathode 20. The filament power supply 42 produces heating of filament cathode 20.

In accordance with an aspect of the invention, gaseous $H_2O$ is used as a source feed material for the ion source. By operating the ion source within a temperature range where the free energy of formation of gaseous $H_2O$ is lower than the free energy of formation of the oxides of the tungsten filament and any other refractory metals in the arc chamber, rapid oxidation is prevented. The minimum free energy state of the system is that which keeps the oxygen-bearing gas concentration maximum, thereby preventing or slowing the oxidation of the refractory metals. Problems of short source life and electrically shorting deposits, normally caused by the presence of an oxygen-bearing gas, are avoided or minimized.

Figure 2:
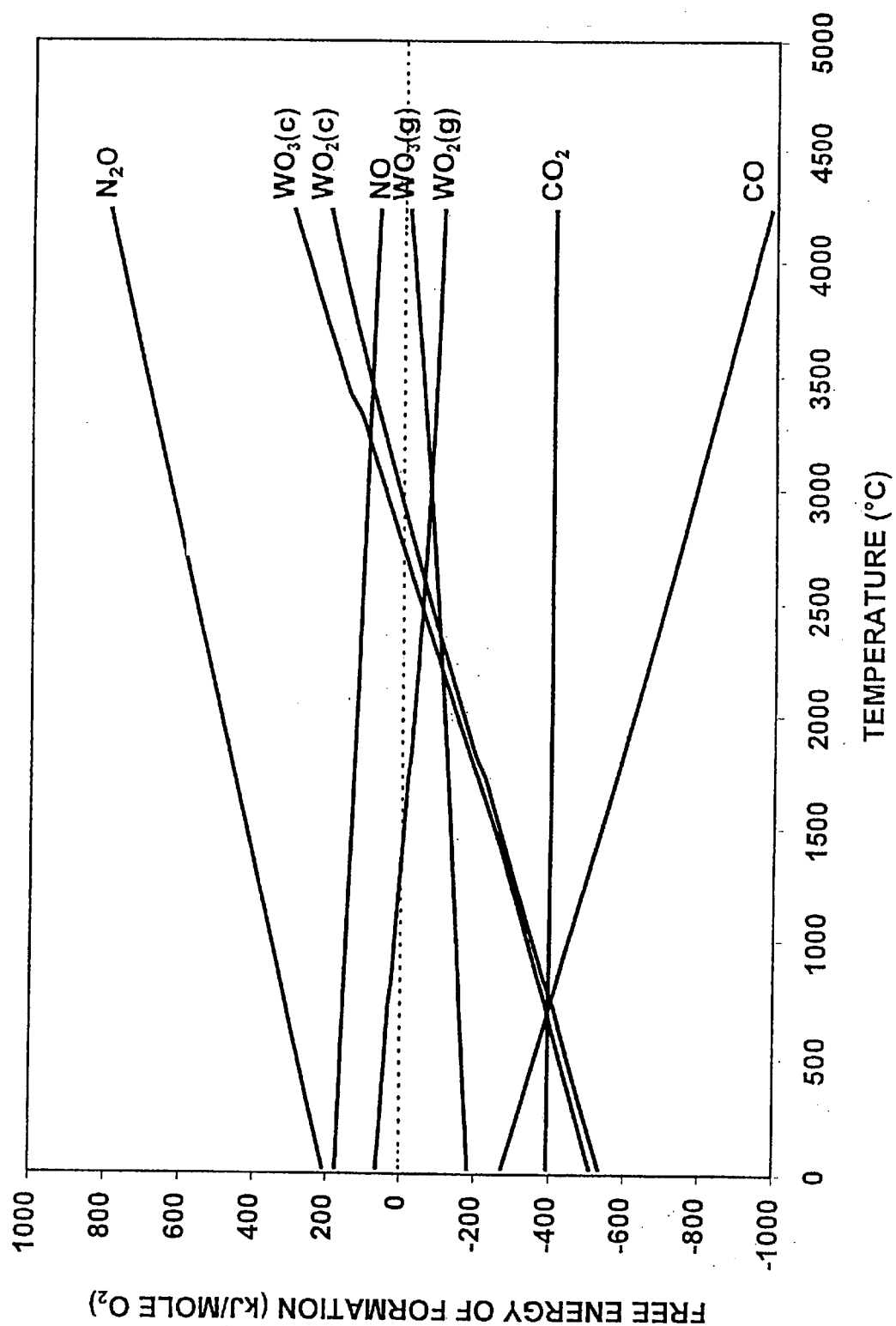
FIG. 2 is a graph of free energy of formation of tungsten oxides and gases that have been used to produce low oxygen beam currents, as a function of temperature.

FIG. 2 is a graph of the free energy of formation of tungsten oxides in gaseous and solid form and gases that have been used to produce low oxygen beam currents as a function of temperature. The free energy of formation is referenced to the free energy of formation of oxygen gas, $O_2$. The curves for gaseous tungsten oxides are labeled $WO_3(g)$ and $WO_2(g)$, and the curves for solid tungsten oxides are labeled $WO_3(c)$ and $WO_2(c)$. Curves are shown for $N_2O$, NO, $CO_2$ and CO gases used to produce oxygen ions. Except for CO and $CO_2$, the gases have free energies of formation that are much higher than the tungsten oxides over the entire temperature range of operation of the arc chamber. This means that the environments in the arc chamber will be highly oxidizing. Although CO and $CO_2$ are not oxidizing over the entire temperature range, carbon deposits from these gases make their use difficult.

Figure 3:
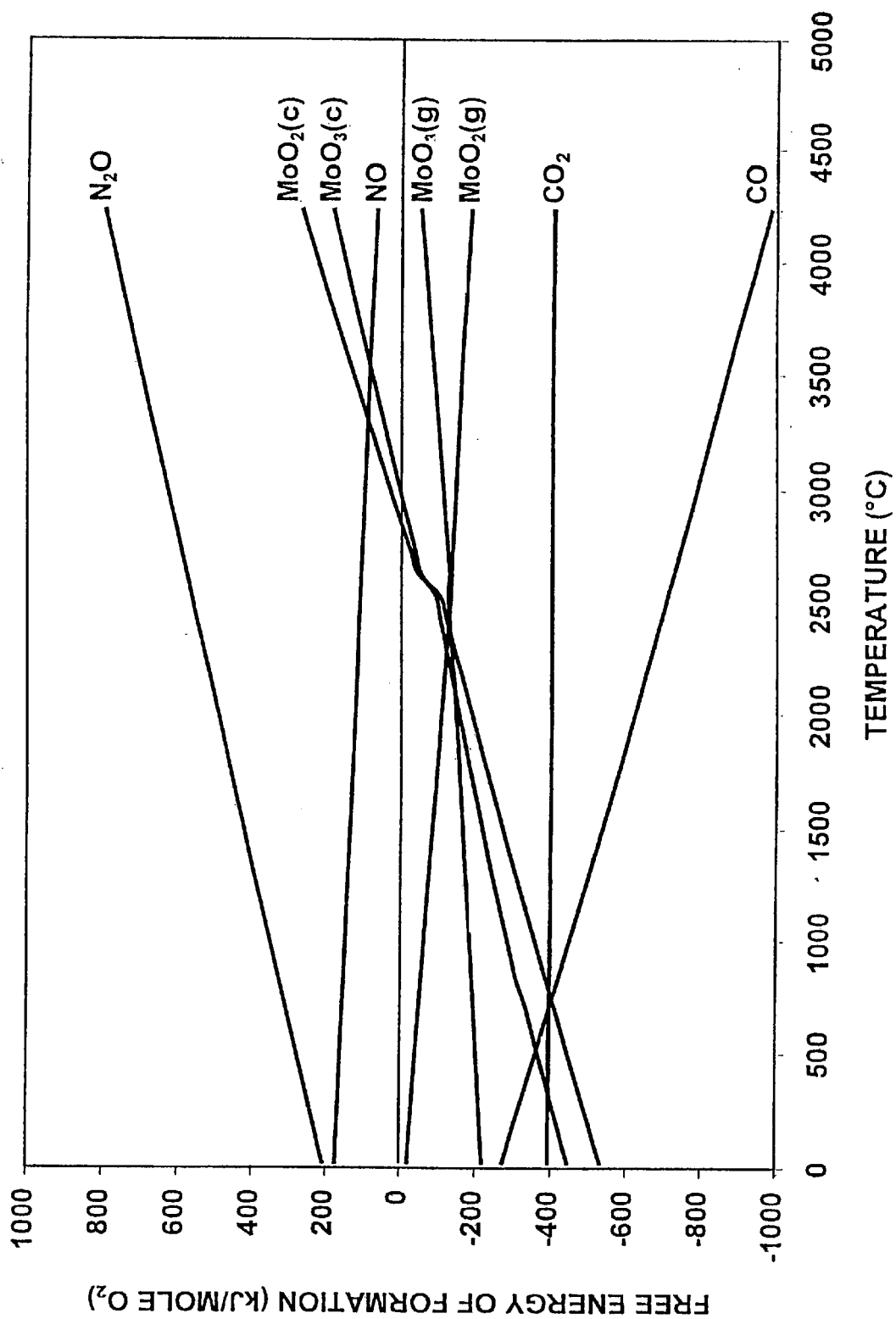
FIG. 3 is a graph of free energy of formation of molybdenum oxides and gases that have been used to produce low oxygen beam currents, as a function of temperature.

FIG. 3 shows the free energy of formation of molybdenum oxides and the gases that have been used to produce low oxygen beam currents, as a function of temperature. The curves for gaseous molybdenum oxides are labeled $MoO_3(g)$ and $MoO_2(g)$, and the curves for solid molybdenum oxides are labeled $MoO_3(c)$ and $MoO_2(c)$. The disadvantages associated with using the specified gases with tungsten oxides also apply to using these gases with molybdenum oxides.

Figure 4:
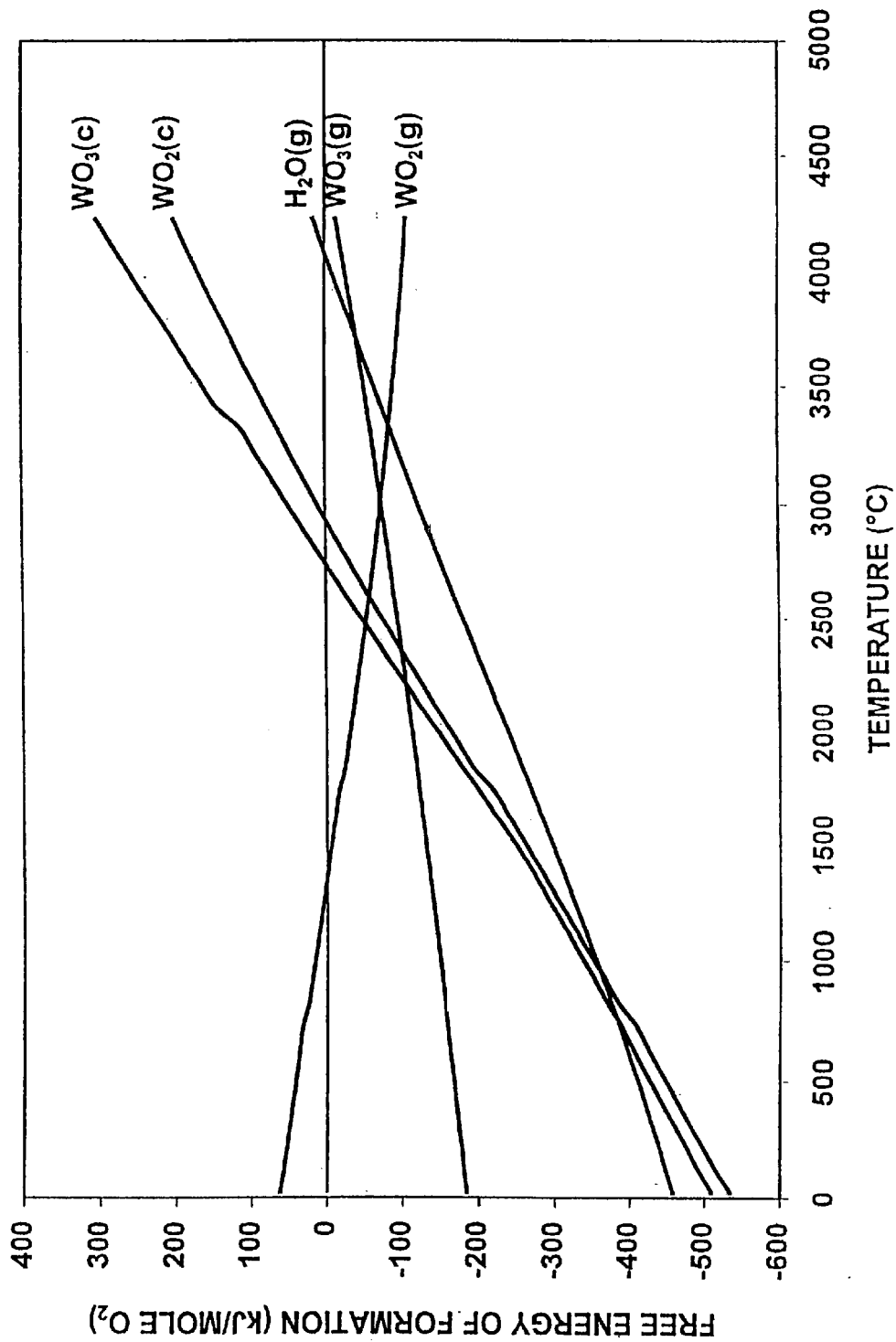
FIG. 4 is a graph of free energy of formation of tungsten oxides and $H_2O$, as a function of temperature.

In FIG. 4, the free energy of formation of $H_2O$ and the tungsten oxides are plotted as a function of temperature. The curves indicate that between about 960° C. and about 3300° C., tungsten will not oxidize in the presence of $H_2O$, because the free energy of formation of gaseous $H_2O$ is lower than the free energy of formation of the tungsten oxides in this temperature range. Medium current sources, where the arc chamber walls operate at less than 600° C., may require a thermal shield in order to raise the operating temperature to about 960° C. A thermal shield 50, shown schematically in FIG. 1, may be utilized to control the operating temperature of arc chamber housing 10 and other arc chamber components. High current sources normally operate with the arc chamber wall at or near 960° C. Tungsten filaments normally operate at temperatures of about 2600° C., within the non-oxidizing temperature range. Because the byproducts of cracking the $H_2O$ are both gaseous under normal conditions and in the arc chamber, no intrinsic electrically conducting deposits are produced.

Figure 5:
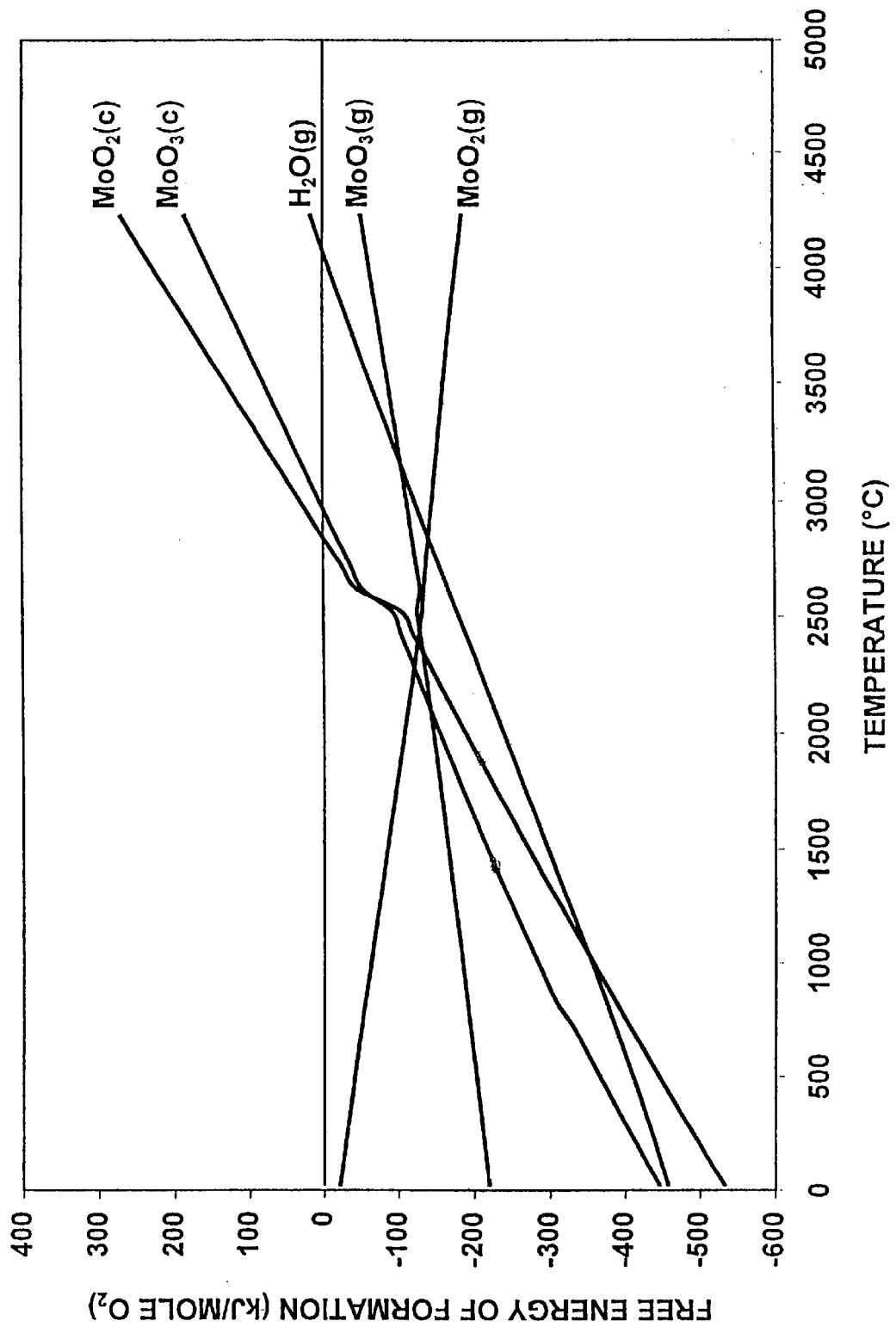
FIG. 5 is a graph of free energy of formation of molybdenum oxides and $H_2O$, as a function of temperature.

FIG. 5 shows the free energy of formation of $H_2O$ and the molybdenum oxides as a function of temperature. Non-oxidizing operation of a molybdenum arc chamber may be obtained between about 1050° C. and about 2800° C.

Figure 6:
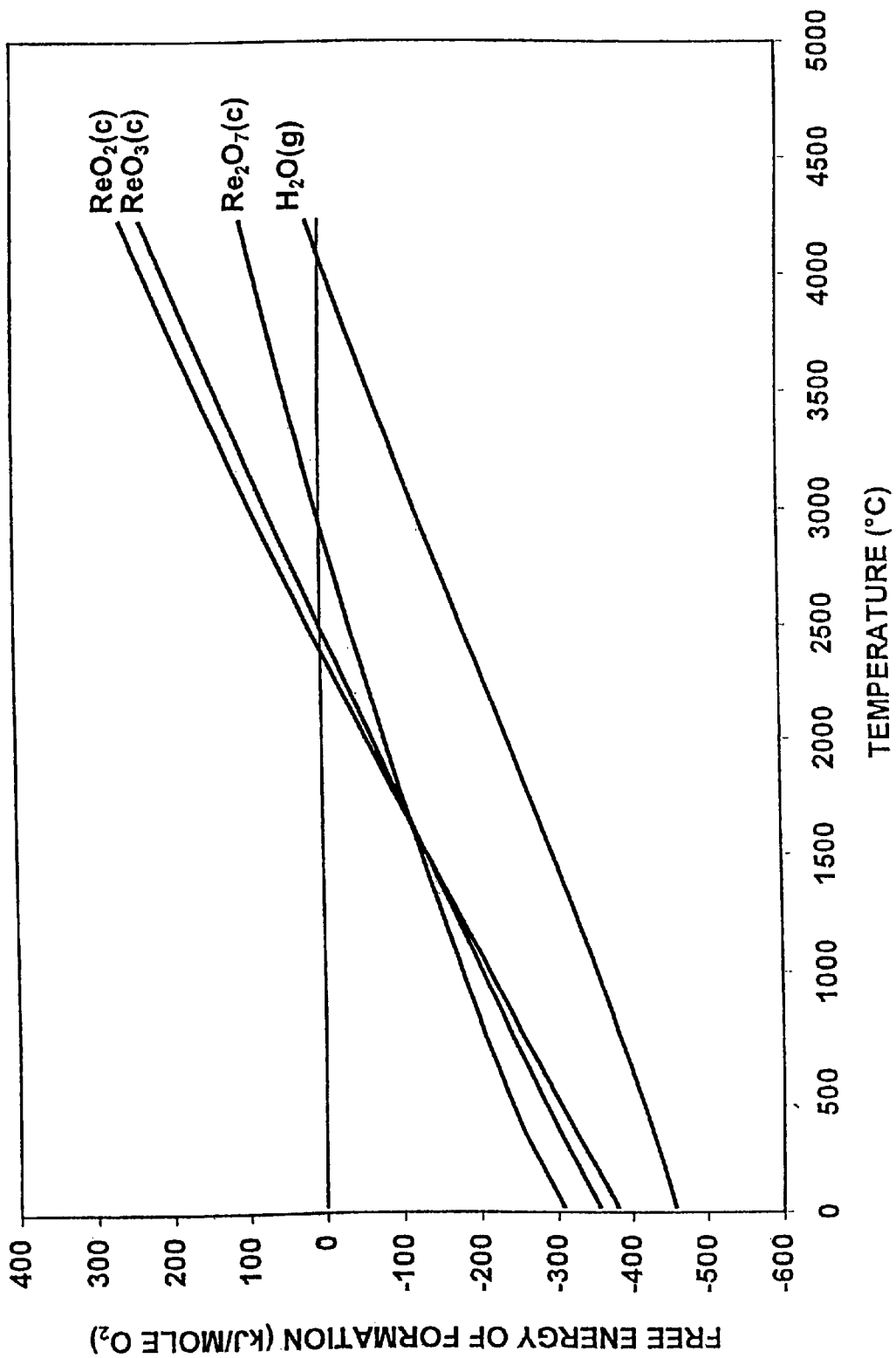
FIG. 6 is a graph of free energy of formation of rhenium oxides and $H_2O$, as a function of temperature.

FIG. 6 shows the free energy of formation of $H_2O$ and the oxides of rhenium as a function of temperature. The curves for solid oxides of rhenium are labeled $ReO_2(c)$, $ReO_3(c)$ and $ReO_7(c)$. Non-oxidizing operation of a rhenium arc chamber may be obtained over the entire temperature range of interest.

Tests were performed as follows. The arc chamber was preheated by operating an argon discharge at about 500 watts arc power for at least one hour before introduction of the water vapor into the arc chamber. Upon introduction of water vapor into the arc chamber, the arc discharge was re-established quickly to avoid cooling of the arc chamber; and the beam of $O^+$ was tuned using the similar arc power settings as the warm up argon discharge. The $O^+$ beam was maximized by adjustments of arc discharge power input, $H_2O$ gas flow, and standard tuning parameters. Tests conducted in a high current ion implanter and in a medium current ion implanter had similar results. The tungsten components of the arc chamber did not show any severe erosion or oxidation that would normally be expected if it were exposed to oxygen-bearing gas, such as $O_2$, NO, or $N_2O$. Neither were there excessive metallic deposits that would normally be expected if $CO_2$ or CO were used as gas feeds. Stable beam currents of up to 7.5 mA of $O^+$ were obtained in the high current implanter; and beam currents of up to 3.3 mA of $O^+$ were obtained in the medium current implanter. The high current implanter showed a potential for up to 15 mA of $O^+$ beam if insulators resistant to oxidation in the $H_2O$ environment were used.

Having thus described at least one illustrative embodiment of the invention, various modifications and improvements will readily occur to those skilled in the art and are intended to be within the scope of the invention. Accordingly, the foregoing description is by way of example only and is not intended as limiting. The invention is limited only as defined in the following claims and the equivalents thereto.

What is claimed is:

1. A method for generating oxygen ions in an ion source including an arc chamber containing at least one oxidizable metal, comprising the steps of:

feeding gaseous $H_2O$ into the arc chamber; and operating the arc chamber in a temperature range where the free energy of formation of gaseous $H_2O$ is less than the free energy of formation of oxides of the oxidizable metal.

2. A method as defined in claim 1 wherein the metal comprises tungsten and wherein the arc chamber is operated in a temperature range of about 960° C. to about 3300° C.

3. A method as defined in claim 1 wherein the metal comprises molybdenum and wherein the arc chamber is operated in a temperature range of about 1050° C. to about 2800° C.

4. A method as defined in claim 1 wherein the metal comprises rhenium.

5. A method as defined in claim 1 wherein the step of operating the arc chamber comprises controlling the temperature of the arc chamber within said temperature range.

6. A method as defined in claim 5 wherein the step of controlling the temperature comprises thermally shielding the arc chamber.

7. An oxygen ion source comprising:
an arc chamber containing a cathode;
a source of gaseous $H_2O$ coupled to the arc chamber for introducing gaseous $H_2O$ into the arc chamber; and
an energy source for producing a plasma in the arc chamber.

8. An oxygen ion source as defined in claim 7 wherein at least one component of the arc chamber comprises an oxidizable metal, said source further comprising a temperature control device for operating the arc chamber in a temperature range where the free energy of formation of gaseous $H_2O$ is less than the free energy of formation of oxides of the oxidizable metal.

9. An oxygen ion source as defined in claim 8 wherein the metal comprises tungsten and wherein the arc chamber is operated in a temperature range of about 960° C. to about 3300° C.

10. An oxygen ion source as defined in claim 8 wherein the metal comprises molybdenum and wherein the arc chamber is operated in a temperature range of about 1050° C. to about 2800° C.

11. An oxygen ion source as defined in claim 8 wherein the temperature control device comprises a thermal shield.

12. An oxygen ion source as defined in claim 7 wherein the metal comprises rhenium.

13. An oxygen ion source as defined in claim 7 wherein the arc chamber is fabricated of a metal selected from the group consisting of tungsten, molybdenum, rhenium and alloys thereof.

14. An oxygen ion source as defined in claim 7 wherein the cathode is fabricated of a metal selected from the group consisting of tungsten, molybdenum, rhenium and alloys thereof.

15. A method for generating oxygen ions in an ion source including an arc chamber containing at least one oxidizable metal, comprising the steps of:
feeding gaseous $H_2O$ into the arc chamber; and
ionizing the gaseous $H_2O$ to form oxygen ions.

16. A method as defined in claim 15 wherein the metal comprises tungsten and wherein the arc chamber is operated in a temperature range of about 960° C. to about 3300° C.

17. A method as defined in claim 15 wherein the metal comprises molybdenum and wherein the arc chamber is operated in a temperature range of about 1050° C. to about 2800° C.

18. A method as defined in claim 15 wherein the metal comprises rhenium.

19. A method as defined in claim 15 further comprising the step of operating the arc chamber in a temperature range where the free energy of formation of gaseous $H_2O$ is less than the free energy of formation of oxides of the oxidizable metal.

20. A method as defined in claim 19 wherein the step of operating the arc chamber comprises controlling the temperature of the arc chamber within said temperature range.

21. A method as defined in claim 20 wherein the step of controlling the temperature comprises thermally shielding the arc chamber.

* * * * *